US010189707B2

(12) United States Patent
Ding et al.

(10) Patent No.: US 10,189,707 B2
(45) Date of Patent: Jan. 29, 2019

(54) EMBEDDED STRUCTURES FOR HIGH GLASS STRENGTH AND ROBUST PACKAGING

(71) Applicant: Continental Automotive Systems, Inc., Auburn Hills, MI (US)

(72) Inventors: Xiaoyi Ding, Lake Zurich, IL (US); James Nowicki, Libertyville, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 64 days.

(21) Appl. No.: 15/499,381

(22) Filed: Apr. 27, 2017

(65) Prior Publication Data

US 2017/0225950 A1 Aug. 10, 2017

Related U.S. Application Data

(62) Division of application No. 14/931,437, filed on Nov. 3, 2015, now Pat. No. 9,676,618.

(60) Provisional application No. 62/118,618, filed on Feb. 20, 2015.

(51) Int. Cl.
| H04R 23/00 | (2006.01) |
| B81C 1/00 | (2006.01) |
| G01L 13/02 | (2006.01) |
| B81B 7/00 | (2006.01) |
| G01L 19/06 | (2006.01) |

(52) U.S. Cl.
CPC ........ B81C 1/00888 (2013.01); B81B 7/0019 (2013.01); B81C 1/00182 (2013.01); G01L 13/025 (2013.01); G01L 19/0654 (2013.01); *B81B 2201/0264* (2013.01); *B81C 2201/019* (2013.01); *B81C 2203/031* (2013.01); *B81C 2203/032* (2013.01)

(58) Field of Classification Search
CPC ............ B81C 1/00888; B81C 1/00182; B81C 2201/019; B81C 2203/031; B81C 2203/032; B81B 7/0019; B81B 2201/0264; G01L 13/025; G01L 19/0264; H01L 2224/48091
USPC .................................. 257/418, 416; 438/113
See application file for complete search history.

(56) References Cited

U.S. PATENT DOCUMENTS

| 5,932,809 A | 8/1999 | Sparks .................. G01L 9/0055 73/726 |
| 6,184,064 B1 | 2/2001 | Jiang ....................... H01L 24/32 257/739 |
| 8,618,675 B2 | 12/2013 | Ding et al. |
| (Continued) | | |

FOREIGN PATENT DOCUMENTS

| CN | 1484328 A | 3/2004 |
| CN | 101156242 A | 4/2008 |
| (Continued) | | |

*Primary Examiner* — Dzung Tran

(57) ABSTRACT

A sensor device is constructed to maintain a high glass strength to avoid the glass failure at low burst pressure, resulting from the sawing defects located in the critical high stress area of the glass pedestal as one of the materials used for construction of the sensor. This is achieved by forming polished recess structures in the critical high stress areas of the sawing street area. The sensor device is also constructed to have a robust bonding with the die attach material by creating a plurality of micro-posts on the mounting surface of the glass pedestal.

15 Claims, 4 Drawing Sheets

(56) References Cited

U.S. PATENT DOCUMENTS

| | | | |
|---|---|---|---|
| 8,692,340 B1 | 4/2014 | Ata | B81B 3/001 257/415 |
| 2006/0215858 A1 | 9/2006 | Pedersen | B81B 3/0072 381/191 |
| 2008/0259725 A1 | 10/2008 | Bayram | B06B 1/0292 367/7 |
| 2010/0016928 A1 | 1/2010 | Zdeblick | A61N 1/05 607/72 |
| 2010/0052082 A1 | 3/2010 | Lee | B81B 7/0061 257/416 |
| 2012/0199921 A1* | 8/2012 | Tanaka | B81C 1/00238 257/415 |

FOREIGN PATENT DOCUMENTS

| | | |
|---|---|---|
| CN | 101665230 A | 3/2010 |
| CN | 101900625 A | 12/2010 |
| CN | 102725618 A | 10/2012 |

\* cited by examiner

EMBEDDED STRUCTURES FOR HIGH GLASS STRENGTH AND ROBUST PACKAGING

CROSS-REFERENCE TO RELATED APPLICATIONS

This application is a divisional application of U.S. application Ser. No. 14/931,437, filed on Nov. 3, 2015, which claims the benefit of U.S. Provisional Application No. 62/118,618 filed Feb. 20, 2015. The disclosure of the above applications are incorporated herein by reference.

FIELD OF THE INVENTION

The invention relates generally to a sensor device which includes embedded structures in a wafer sawing street and a die mounting surface, to maintain the intrinsic glass strength for a high burst pressure, and to enhance the die adhesion with mounting material for a robust packaging design capable of resisting aggressive thermal shocks, and a hot/humid environment.

BACKGROUND OF THE INVENTION

Due to the maturity of wafer bonding technology and low MEMS (micro-electrical-mechanical systems) fabrication cost, borosilicate glass is widely used in current MEMS based sensors and actuators. Various types of pressure sensors which use this technology include differential pressure sensors, front side absolute pressure sensors, and backside absolute pressure sensors.

In situations where the glass has no major defects, such as those from the starting material from the fabriction process, the borosilicate glass used in the pressure sensors is strong enough to survive a high burst pressure, up to more than 100 bar for a typical structure shape and size. Glass defects may be, however, induced by the device fabrication process. It is the defects induced by the fabrication process that cause the glass to fail at a low pressure, for example, less than 50 bar, compared a structure having a similar size and shape having no defects. One of the major process steps which may induce glass defects is the wafer sawing to singulate the individual devices from the wafer stack, which often creates the mechanical defects around the sidewalls of the glass, such as cracking and chipping. If these defects are located in one of the high-stress areas, such as around the Si and glass interface, and around the die attach interface, the glass is more susceptible to failure when exposed to a high pressure. For example, in a differential or backside absolute pressure sensor, the glass may fail when around 30 bar (or less) of pressure.

The defect-free borosilicate glass wafers are normally polished on both surfaces, which may reduce the adhesion with a die mounting material, such as a paste, in a sensor device. The adhesion of the die with the mounting material may be degraded if the sensor is exposed to a hot and humid environment, or experiences thermal shocks, which often results in a device output instability and/or malfunction.

Accordingly, there exists a need for an MEMS device which is able to survive when exposed to a high burst pressure, and is robust in a harsh environment, which may include thermal shocks, and high humidity under an elevated temperature.

SUMMARY OF THE INVENTION

The present invention is a sensor device which is constructed to maintain high glass strength and enhance the device integrity in a harsh environment, which may include thermal shocks, and high humidity under an elevated temperature.

It is therefore an object of this invention to eliminate the sawing defects located in the critical high stress areas by forming polished recess structures in the critical high stress area in the sawing street. The recess structures are arranged in such a way that during sawing, the saw blade does not touch the outer walls of the recesses, thus avoiding the creation of any sawing defects in the critical high stress areas.

The glass wafers used in the MEMS device according to the present invention are polished to remove the mechanical defects induced in wafer slicing and thinning from the bulk glass material. A highly polished glass surface has weak adhesion to the mounting material. It is therefore another object of present invention to create a micro-roughness structure on the pedestal glass surface facing the die mounting material to increase the mounting area and enhance the interlocking force with the mounting material.

In one embodiment, the mounting surface of the MEMS device includes a structure made of an array of micro-posts which protrude from the base (non-micro posts area). There are "gaps" in between the micro-posts which allow gas/vapor to be easily vented out through the gaps of the micro-posts during the die attach process. These micro-posts used in the MEMS device of the present invention have been proved to be efficient in various extended test-to-fail tests, including, but not limited to, thermal shocks, exposure to 85% RH at 85° C., and autoclave.

In one embodiment, the present invention is a method of making a pressure sensor, which includes the steps of providing a first wafer having a top surface and a bottom surface, providing a second wafer having a top surface and a bottom surface, and providing a third wafer having a top surface and a bottom surface. The method according to the present invention also includes providing at least one angled recess having at least one angled smooth area formed on the bottom surface as part of the first wafer, providing at least one upper recess having at least one upper smooth area formed on the top surface as part of the second wafer, providing at least one lower recess having at least one lower smooth area formed on the bottom surface as part of the second wafer, and providing at least one outer recess having at least one outer smooth area formed on the bottom surface of the third wafer. The bottom surface of the first wafer is bonded to the top surface of the second wafer at a first bonding interface such that the at least one angled recess is located in proximity to the at least one upper recess. The bottom surface of the third wafer is bonded to the top surface of the first wafer at a second bonding interface such that the at least one outer recess is located in proximity to the second bonding interface. A wafer stack and a saw street area are formed when the first wafer is bonded to the second wafer, and the third wafer is bonded to the first wafer. The wafer stack is partitioned in the saw street area to form at least two pressure sensors.

The method of making a pressure sensor according to the present invention also includes providing a portion of the at least one angled smooth area to be located outside the saw street area, providing a portion of the at least one upper smooth area to be located outside the saw street area, providing a portion of the at least one lower smooth area located outside the saw street area, and providing a portion of the at least one outer smooth area located outside the saw street area. The wafer stack is partitioned such that each of the portion of the at least one angled smooth area, the portion of the at least one upper smooth area, the portion of the at least one lower smooth area, and the portion of the at least one outer smooth area remain intact on the pressure sensor after the wafer stack is partitioned.

The method of making a pressure sensor according to the present invention also includes the steps of providing a first material removal area formed as part of the first wafer in proximity to the angled recess and located in the saw street area, providing a second material removal area formed as part of the second wafer in proximity to the upper recess and located in the saw street area, and providing a third material removal area formed as part of the third wafer in proximity to the outer recess and located in the saw street area. Each of the first material removal area, the second material removal area, and the third material removal area is eliminated as the wafer stack is partitioned The method of making a pressure sensor according to the present invention also includes providing at least one pressure sensing element formed as part of the first wafer, providing at least one pedestal formed as part of the second wafer, and providing at least one cap formed as part of the third wafer. The wafer stack is partitioned such that one of the at least two pressure sensors have the at least one pressure sensing element, the at least one pedestal, and the at least one cap.

The method of making a pressure sensor according to the present invention also includes the steps of providing a plurality of micro-posts formed on the bottom surface of the glass pedestal, and providing at least one venting area in proximity to at least one of the plurality of micro-posts. The pedestal is bonded to a housing substrate, venting air and vapor away from the at least one venting area as the pressure sensor is attached to a housing substrate.

The method of making a pressure sensor according to the present invention also includes the steps of providing a cavity formed as part of the at least one pressure sensing element, providing a cap cavity formed as part of the cap, and providing an aperture formed as part of the pedestal, which is in fluid communication with the cavity. The method also includes detecting the pressure applied to the pressure sensing element in the cavity by measuring the pressure sensor output change due to the deflection of the pressure sensing element.

The method of making a pressure sensor according to the present invention also includes the steps of forming at least a partial vacuum in the cap cavity by bonding the bottom surface of the third wafer to top surface of the first wafer.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1A:
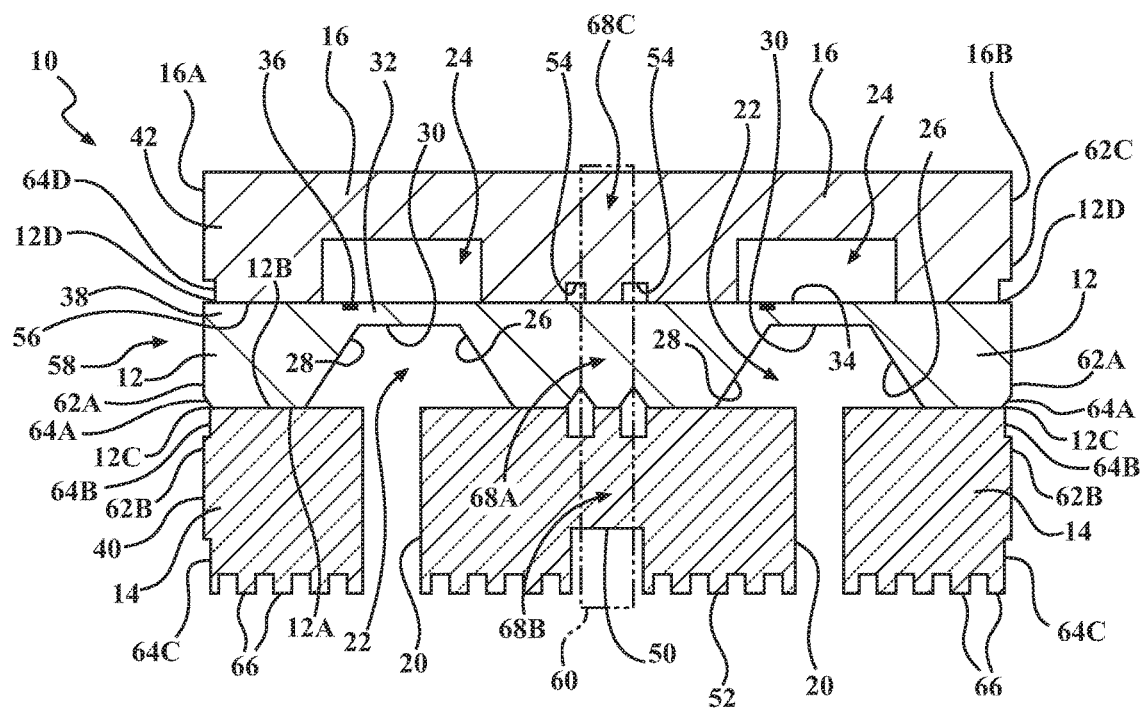
FIG. 1A is a sectional side view of a first embodiment of a wafer stack used to make a plurality of pressure sensor structures, according to embodiments of the present invention.

The following description of the preferred embodiment(s) is merely exemplary in nature and is in no way intended to limit the invention, its application, or uses.

A first embodiment of a MEMS sensor structure according to the present invention is shown in FIGS. 1A-2B, generally at 10. Typically, the MEMS fabrication process generates thousands of the same devices from one wafer stack. For simplicity, FIGS. 1A-2A only show a portion of a wafer stack used to make two sensor structures 10. In this embodiment, the pressure sensor structure 10 includes two backside absolute pressure sensors, shown generally at 10A, 10B, each of which includes a silicon structure in the form of a pressure sensing element 12, and pedestal glass structure in the form of a glass pedestal 14. Formed as part of the glass pedestal 14 is an aperture 20, and the aperture 20 is in fluid communication with a cavity, shown generally at 22. The pressure sensing element 12 includes a bottom surface 12A which is anodically bonded to a top surface 12B of the glass pedestal 14, forming a bonding interface 12C.

Figure 1B:
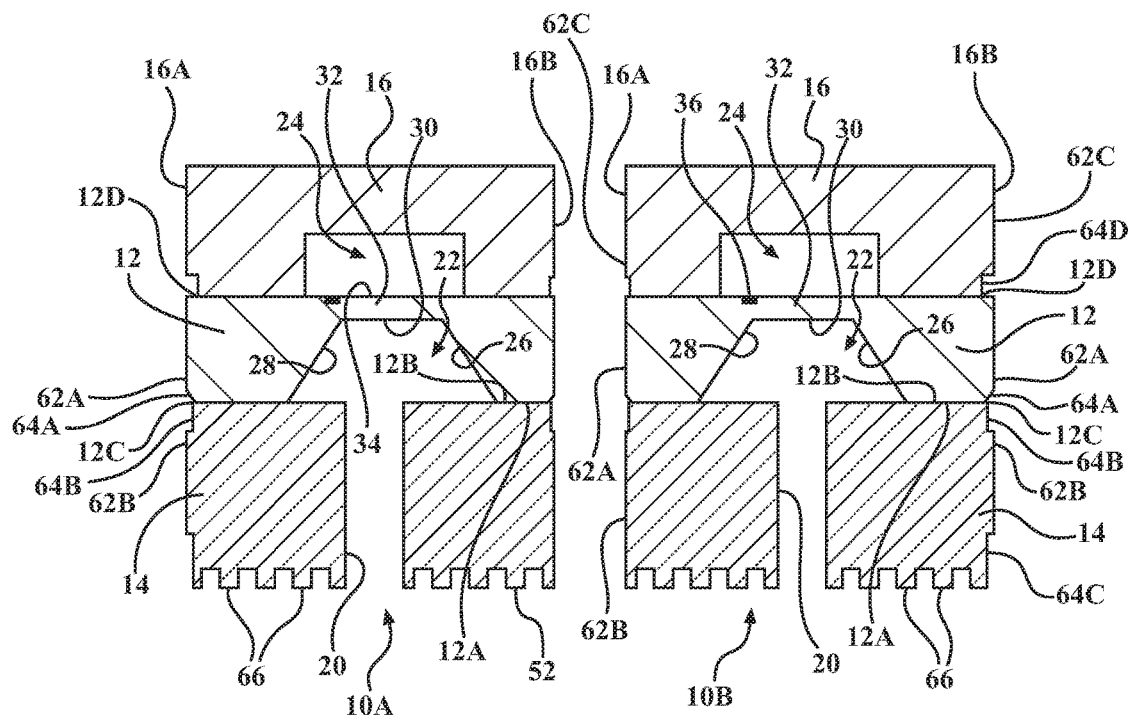
FIG. 1B is a sectional side view of a first embodiment of two pressure sensors after a wafer stack is partitioned, according to embodiments of the present invention.

The cavity 22 is etched into the bottom surface 12A of the pressure sensing element 12, and includes four inner surfaces, where only a first inner surface 26 and a second inner surface 28 are depicted in FIGS. 1A and 1B, because FIGS. 1A and 1B are cross-sectional views. Each of the four inner surfaces terminates into a backside surface 30, which is part of a diaphragm 32. In one embodiment, the cavity 22 is formed using an anisotropic chemical etching by potassium hydroxide (KOH), tetramethylammonium hydroxide (TMAH), etc, or a dry etch by deep reactive ion etch (DRIE), but it is within the scope of the invention that other processes may be used.

The pressure sensing element 12 is made from a single crystalline silicon, and includes the diaphragm 32 having a top surface 34, and the cavity 22 having surfaces 26,28, and 30. The top surface 30 of the cavity 22 is also the backside surface of the diaphragm 32. The pressure sensing element 12 also includes a bridge circuitry 36 on the top surface 34 of the diaphragm 32. In one embodiment, the bridge circuitry 36 contains at least four separate piezoresistors connected by P+ doped and/or metal interconnects. The piezoresistors may be placed in one of several configurations. The piezoresistors may be located close to one side of the edge of the diaphragm 32, close to four sides of the edge of the diaphragm 32, or distributed in one direction across the diaphragm 32. For drawing simplicity, FIGS. 1A and 1B do not include these details, such as interconnects, or the location of each piezoresistor. Instead, reference numeral 36 in FIGS. 1A and 1B is used to represent a generic bridge circuitry, which may be in any configuration and location as generally known in the field.

The diaphragm 32 is relatively thin, and the thickness of the diaphragm 32 depends upon the diaphragm size and the pressure sensing range. The diaphragm 32 deflects in response to pressure applied to the backside surface 30 through the aperture 20 of the substrate 14 and the cavity 22, as shown in FIGS. 1A and 1B. The deflections of the diaphragm 32 resulting from the applied pressure causes an imbalance in the bridge circuitry 36 such that the output of the bridge circuitry 36 correlates to the pressure signal.

As mentioned above, the pressure sensors 10A,10B are backside absolute pressure sensors 10A,10B. The sensors 10A,10B include a cap glass substrate, in the form of a cap 16. In one embodiment, the cap 16 includes sidewalls 16A,16B, and a cap cavity, shown generally at 24. The cap 16 is anodically bonded to the sensing element 12 as a second bonding interface 12D, such that the cap cavity 24 is on top of diaphragm 32, and the pedestal 14 is anodically bonded to the pressure sensing element 12 in such a way that the cap cavity 24 is hermetically sealed as at least a partial vacuum. This allows the pressure sensors 10A,10B to measure absolute pressure. The length and width of the cap cavity 24 are bigger than but close to the length and width of the diaphragm 32.

Figure 2A:
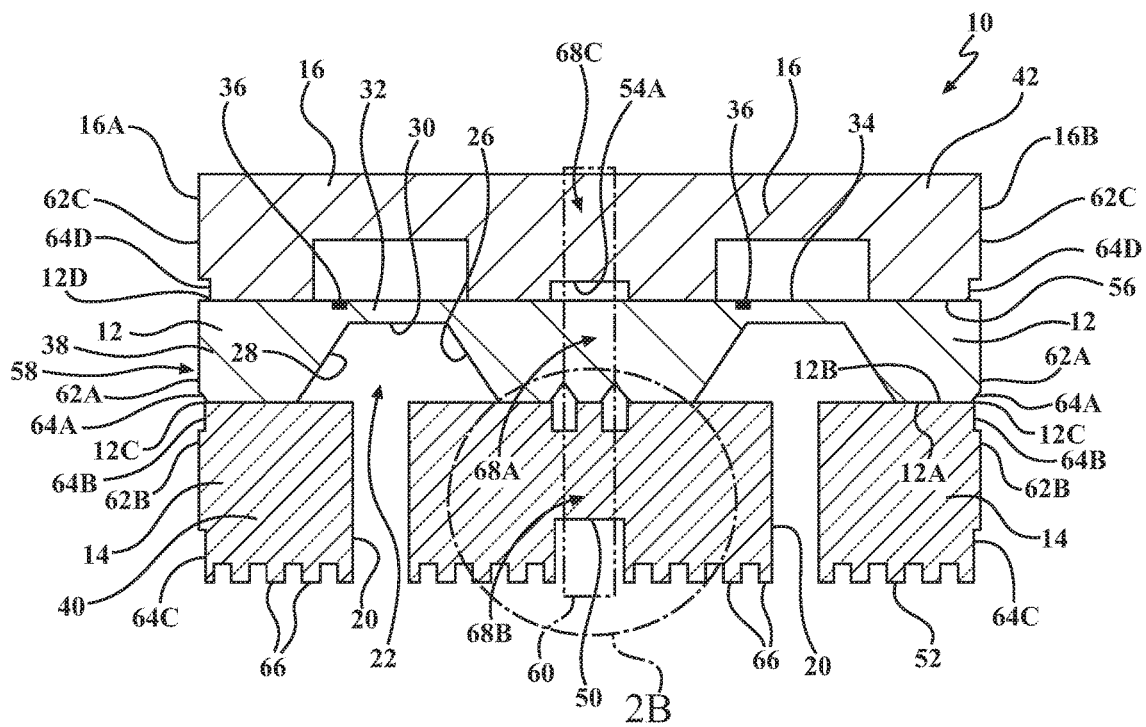
FIG. 2A is a second sectional side view of a second embodiment of a wafer stack used to make a plurality of pressure sensor structures, according to embodiments of the present invention.
Figure 2B:
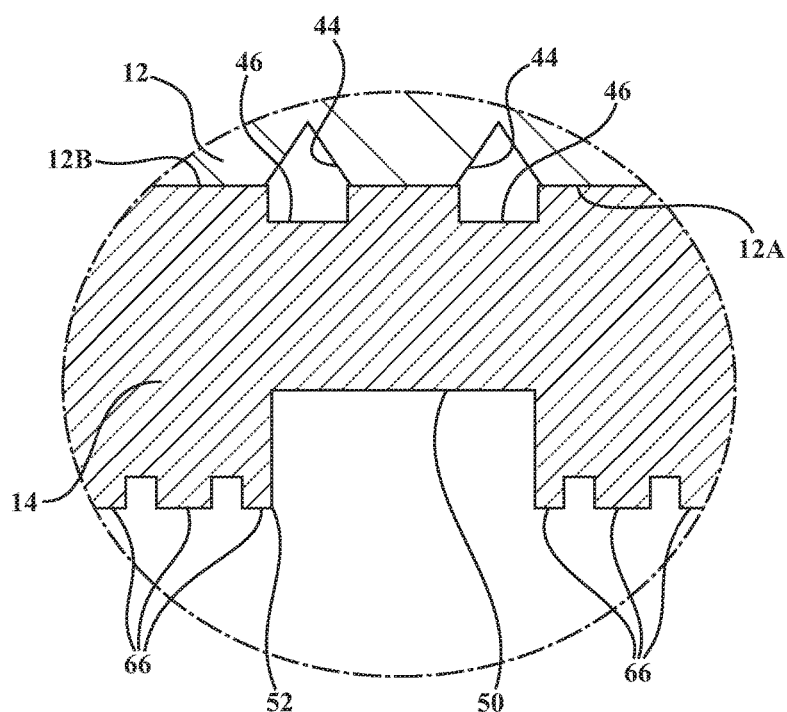
FIG. 2B is a magnified view of the circled portion in FIG. 2A.
Figure 3A:
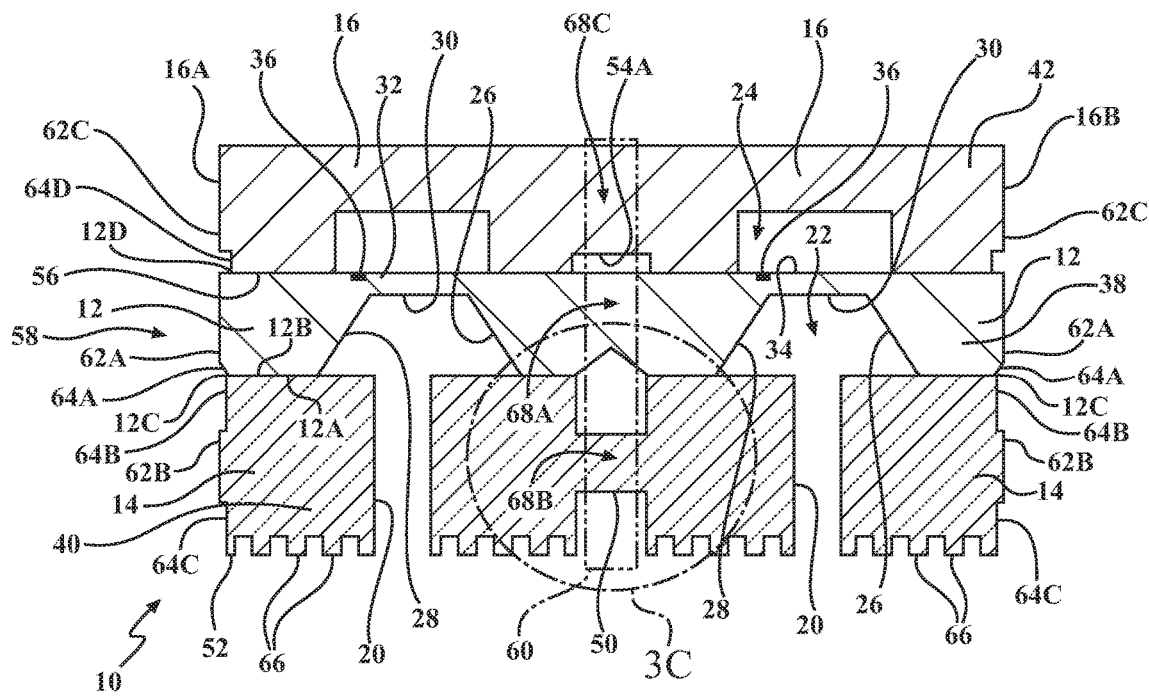
FIG. 3A is a sectional side view of a third embodiment of a wafer stack used to make a plurality of pressure sensor structures, according to embodiments of the present invention.
Figure 3B:
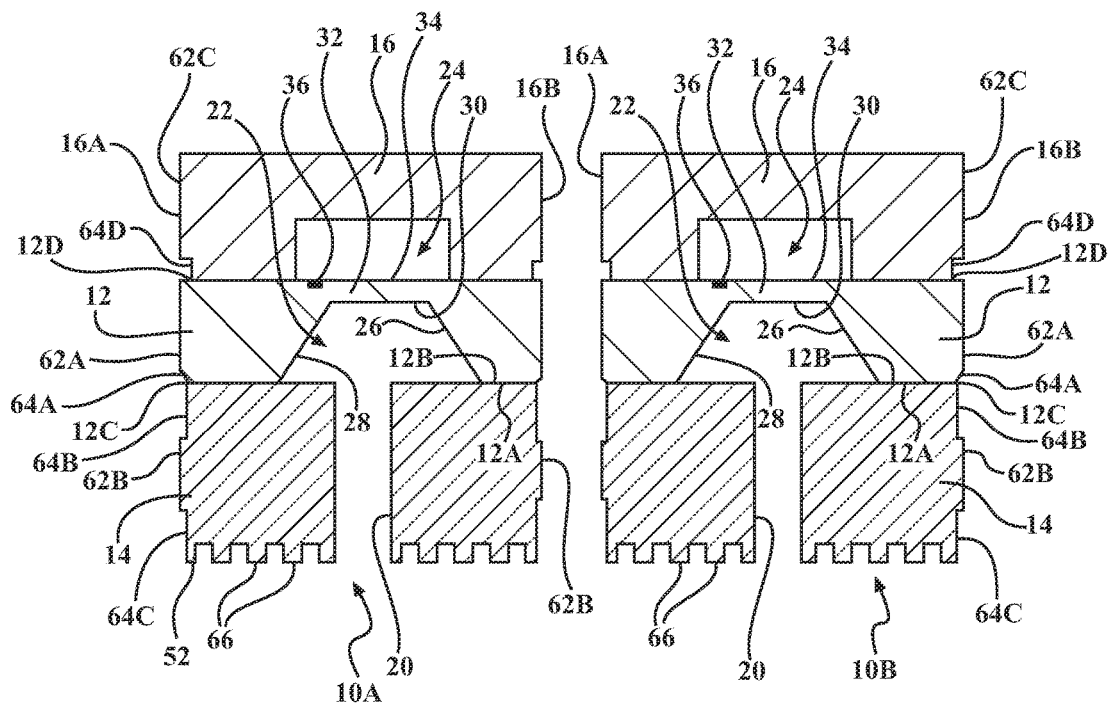
FIG. 3B is a sectional side view of a third embodiment of two pressure sensors after a wafer stack is partitioned, according to embodiments of the present invention.
Figure 3C:
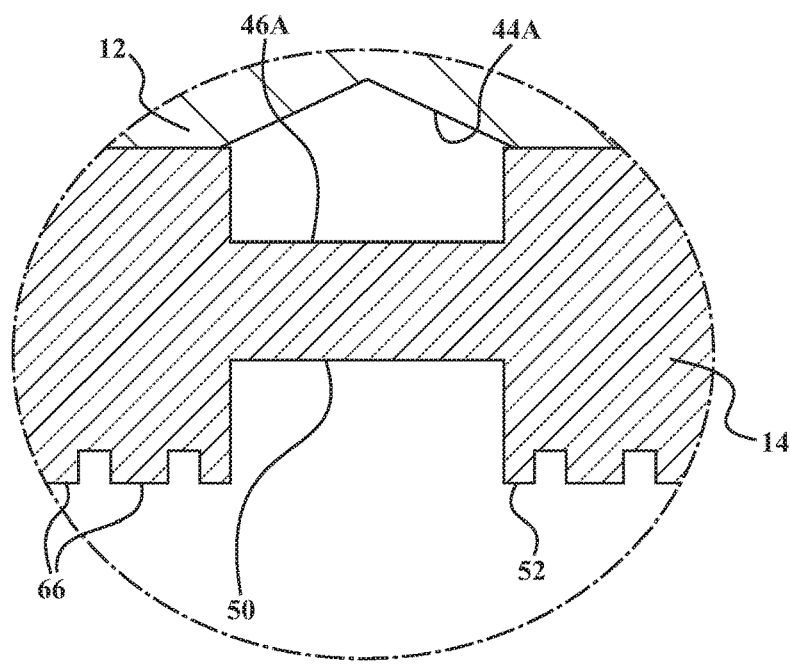
FIG. 3C is a magnified sectional side view of the circled portion in FIG. 3A.

To fabricate the sensors 10A,10B, there is a first wafer 38 which is used to create the pressure sensing elements 12, a second wafer 40 used to create the pedestals 14, and a third wafer 42 used to create each cap 16. Also formed as part of the sensor structure 10 are multiple embedded structures, which in this embodiment are recesses. More specifically, there are angled recesses 44 formed on the bottom surface 12A of the first wafer 38, upper recesses 46 formed on the top surface 12B of the second wafer 40, and one lower recess 50 formed from the bottom surface 52 of the glass pedestal 14. There are also outer recesses 54 formed on the bottom surface 56 of the third wafer 42 used to form each cap 16. In an alternate embodiment, instead of the two outer recesses 54 being formed as part of the third wafer 42, as shown in FIG. 1A, there may be a single outer recess 54A formed as part of the bottom surface 56 of the third wafer 42, as shown in FIGS. 2A and 3A.

The second wafer 40 is bonded to the bottom surface 12A of the first wafer 38, and the third wafer 42 is bonded to the top surface 34 of the first wafer 38 to form a wafer stack, shown generally at 58 in FIG. 1A. All recesses are at least partially located in an area of what is referred to as a "saw street," shown in the area indicated at 60, where the saw street 60 is the area which is cut to separate the wafer stack 58 in the embodiment shown in FIG. 1A, into the individual sensors 10A,10B, shown in FIG. 1B. In the embodiment shown in FIGS. 1A and 1B, the area of the saw street 60 is cut between the two angled recesses 44, between the two outer recesses 54, and through the third wafer 42 between the two upper resesses 46 and in the area of the wide recess 50.

All recesses 44,46,50,54 are fabricated prior to the wafer bonding step forming the wafer stack 58. This fabrication method provides the capability of chemically etching and polishing the surfaces of all recesses 44,46,50,54 to eliminate or minimize the mechanical defects created during fabrication of the recesses. During operation, the sensors 10A,10B are exposed to thermal stress and bending stress. The bonding interface 12C between the sensing element 12 and the pedestal 14, and the bonding interface between the pedestal 14 and a housing substrate, are each exposed to a high stress. There are several areas which may have a rough surface after being cut through with the saw blade, and several areas which are smooth and polished, that were part of the various recesses 44,46,50,54 prior to the wafer stack 58 undergoing the cutting process. More specifically, there is a first rough area 62A formed as part of the pressure sensing element 12, a second rough area 62B formed as part of the pedestal 14, and a third rough area 62C formed as part of the cap 16. There are also several smooth areas which remain after the cutting process, which were part of the recesses 44,46,50,54 prior to the cutting process. More specifically, there is an angled smooth area 64A formed as part of the pressure sensing element 12 which is part of one of the angled recesses 44, an upper smooth area 64B formed as part of the pedestal 14 adjacent the angled smooth area 64A that was part of one of the upper recesses 46, a lower smooth area 64C formed as part of the pedestal 14 which was part of the lower recess 50, and an outer smooth area 64D formed as part of the cap 16, which was part of one of the outer recesses 54.

The widths and locations of the recesses 44,46,50,54 in the Figures are arranged in a such a way that the sawing blades used to singulate individual sensors 10A,10B from the wafer stack 58, as shown in FIG. 1B, do not touch any polished external side walls (remaining smooth areas 64A, 64B,64C,64D) of the recesses 44,46,50,54, so that the areas 64A,64B,64C,64D (which are exposed to high stress) remain intact after the cutting process, and are smooth with minor defects or are defect free. This structure and fabrication method shown in FIGS. 1A to 1B helps maintain strength such that the sensors 10A,10B are robust when exposed to high thermal and bending stresses.

In addition to the recesses 44,46,50,54, there are also areas of material which are removed during the cutting process. These areas are shown at 68A,68B,68C in FIGS. 1A and 2A. More specifically, there is a first material removal area 68A which is part of the first wafer 38 between each sensing element 12, a second material removal area 68B which is part of the second wafer 40 in the area between each pedestal 14, and a third material removal area 68C which is part of the third wafer 42 in the area between each cap 16. The material removal areas 68A,68C,68C are excess material that is part of each respective wafer in the wafer stack 58, but are intended to be removed during the cutting process such that each sensor 10A,10B is the correct dimensions after the cutting process. The cutting process eliminates each of the material removal areas 68A,68B,68C, such that the rough areas 62A,62B,62C are left after the cutting process is complete. It is also shown in the Figures that the material removal areas 68A,68B,68C are separate from the smooth areas 64A,64B,64C,64D that are part of each of the recesses 44,46,50,54. The smooth areas 64A,64B,64C,64D have undergone the etching and polishing process, as mentioned above, and are not damaged during the cutting process, and are therefore able to maintain bond integrity, and are more resistant to bending and thermal stresses.

Figure 4:
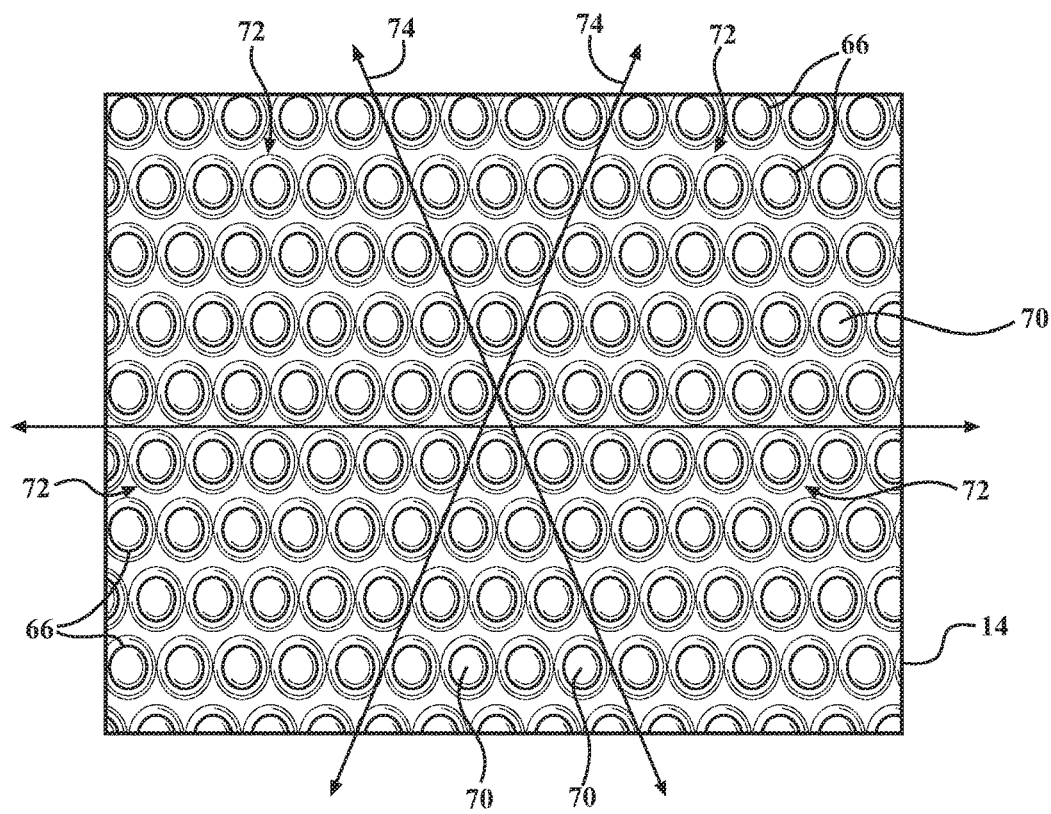
FIG. 4 is an enlarged view of the circled portion shown in FIG. 1B of micro-posts formed on part of a pedestal, according to embodiments of the present invention.

Referring again to the Figures generally, each embodiment includes a plurality of micro-posts 66 formed as part of the bottom of the glass pedestal 14, which are shown in FIG. 4 in an enlarged bottom view. The micro-posts 66 protrude a few of microns (in length) from the bottom surface 52 of the pedestal 14, and arranged in such a way that the vapor and air is vented out from the bottom surface of the glass pedestal 14 during the bonding to the housing substrate. More specifically, the bottom surfaces 70 of the micro-posts 66 are connected to the housing substrate by a mounting material. There is venting area, shown generally at 72 in between each of the posts 66, which allows for the venting of air and vapor during the die mounting process around the posts 66, and out of the venting area 72. Examples of the flow path for the air or vapor are shown by the arrows 74. This ensures no voids in the mounting material are created during the bonding of the pedestal 14 to the housing substrate.

Another embodiment of the present invention is shown in FIGS. 3A-4B, with like numbers referring to like elements. In this embodiment, instead of having multiple angled recesses 44 formed between the pressure sensing elements 12 and pedestal 14, there is only a single angled recess 44A, a single wide upper recess 46A, and the single lower recess 50 formed in each saw street 60 separating the individual sensors 10A and 10B from the wafer stack 58.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for making a pressure sensor, comprising the steps of:
   providing a first wafer; and
   providing a second wafer;
   forming at least one angled recess as part of the first wafer;
   forming at least one upper recess as part of the second wafer;
   forming at least one lower recess as part of the second wafer;
   bonding the first wafer to the second wafer to form a wafer stack having at least one saw street area, such that the at least one angled recess, the at least one upper recess, and the at least one lower recess are partially located in the saw street area;
   partitioning the wafer stack in the saw street area to form at least two pressure sensors.

2. The method for making a pressure sensor of claim 1, further comprising the steps of:
   providing a third wafer;
   forming at least one outer recess as part of the third wafer, the at least one outer recess located in the saw street area;
   bonding the third wafer to the second wafer such that the third wafer is part of the wafer stack, and the at least one saw street area extends through at least part of the third wafer;
   partitioning the wafer stack such that a portion of the third wafer is part of each of the at least two pressure sensors.

3. The method for making a pressure sensor of claim 2, further comprising the steps of:
   providing a plurality of smooth areas;
   forming a portion of the plurality of smooth areas as part of the at least one angled recess;
   forming a portion of the plurality of smooth areas as part of the at least one upper recess;
   forming a portion of the plurality of smooth areas as part of the at least one lower recess;
   forming a portion of the plurality of smooth areas as part of the at least one outer recess;
   partitioning the wafer stack in the saw street area such that each of the plurality of smooth areas retains full structural integrity.

4. The method for making a pressure sensor of claim 2, further comprising the steps of:
   providing at least one pressure sensing element formed as part of the first wafer;
   providing at least one pedestal formed as part of the second wafer; and
   providing at least one cap formed as part of the third wafer;
   as the wafer stack is partitioned such that one of the at least two pressure sensors have the at least one pressure sensing element, the at least one pedestal, and the at least one cap.

5. The method for making a pressure sensor of claim 4, further comprising the steps of:
   providing a cavity formed as part of the at least one pressure sensing element;
   providing a cap cavity formed as part of the cap; and
   providing an aperture formed as part of the pedestal, the aperture in fluid communication with the cavity;
   detecting the pressure applied to the pressure sensing element in the cavity by measuring the pressure sensor output change due to the deflection of at least a portion of the pressure sensing element.

6. The method for making a pressure sensor of claim 2, further comprising the steps of:
   providing a plurality of micro-posts formed on the bottom surface of the third wafer such that a portion of the plurality of micro-posts are part of each of the at least two pressure sensors; and
   providing at least one venting area in proximity to at least one of the plurality of micro-posts;
   bonding the bottom surface of the third wafer to a housing substrate using a mounting material after the wafer stack has been partitioned;
   venting air and vapor away from the at least one venting area as the plurality of micro-posts is attached to a housing substrate.

7. The method for making a pressure sensor of claim 1, further comprising the steps of:
   providing a plurality of rough areas;
   forming a portion of the rough areas as the wafer stack is partitioned.

8. The method for making a pressure sensor of claim 7, further comprising the steps of:
   providing at least one first material removal area as part of the saw street area in proximity to the at least one angled recess;
   providing at least one second material removal area as part of the saw street area in proximity to the at least one upper at the at least one lower recess;
   providing at least one third material removal area as part of the saw street area in proximity to the at least one outer recess;
   removing the first material removal area, the second material removal area, and the third material removal area as the wafer stack is partitioned.

9. A method of making a pressure sensor, comprising the steps of:
   providing a first wafer having a top surface and a bottom surface;
   providing a second wafer having a top surface and a bottom surface;
   providing a third wafer having a top surface and a bottom surface;
   providing at least one angled recess having at least one angled smooth area formed on the bottom surface as part of the first wafer;

providing at least one upper recess having at least one upper smooth area formed on the top surface as part of the second wafer;

providing at least one lower recess having at least one lower smooth area formed on the bottom surface as part of the second wafer;

providing at least one outer recess having at least one outer smooth area formed on the bottom surface of the third wafer;

bonding the bottom surface of the first wafer to the top surface of the second wafer at a first bonding interface such that the at least one angled recess is located in proximity to the at least one upper recess;

bonding bottom surface of the third wafer to the top surface of the first wafer, at a second bonding interface, and the at least one outer recess is located in proximity to the second bonding interface;

forming a saw street area when the first wafer is bonded to the second wafer, and the third wafer is bonded to the first wafer;

forming a wafer stack when the first wafer is bonded to the second wafer, and the third wafer is bonded to the first wafer;

partitioning the wafer stack in the saw street area to form at least two pressure sensors.

10. The method of making a pressure sensor of claim 9, further comprising the steps of:

providing a portion of the at least one angled smooth area located outside the saw street area;

providing a portion of the at least one upper smooth area located outside the saw street area;

providing a portion of the at least one lower smooth area located outside the saw street area;

providing a portion of the at least one outer smooth area located outside the saw street area;

partitioning the wafer stack such that each of the portion of the at least one angled smooth area, the portion of the at least one upper smooth area, the portion of the at least one lower smooth area, and the portion of the at least one outer smooth area remain intact after the wafer stack is partitioned.

11. The method of making a pressure sensor of claim 9, further comprising the steps of:

providing a first material removal area formed as part of the first wafer in proximity to the angled recess and located in the saw street area; and providing a second material removal area formed as part of the second wafer in proximity to the upper recess and located in the saw street area;

providing a third material removal area formed as part of the third wafer in proximity to the outer recess and located in the saw street area;

removing the first material removal area, the second removal area, and the third material removal area as the wafer stack is partitioned.

12. The method of making a pressure sensor of claim 9, further comprising the steps of:

providing at least one pressure sensing element formed as part of the first wafer;

providing at least one pedestal formed as part of the second wafer;

providing at least one cap formed as part of the third wafer;

as the wafer stack is partitioned such that one of the at least two pressure sensors have the at least one pressure sensing element, the at least one pedestal, and the at least one cap.

13. The method of making a pressure sensor of claim 12, further comprising the steps of:

providing a plurality of micro-posts formed on the bottom surface of the pedestal; and providing at least one venting area in proximity to at least one of the plurality of micro-posts;

bonding the pedestal to a housing substrate using a mounting material;

venting air and vapor away from the at least one venting area as the pressure sensor is attached to a housing substrate.

14. The method of making a pressure sensor of claim 12, further comprising the steps of:

providing a cavity formed as part of the at least one pressure sensing element;

providing a cap cavity formed as part of the cap; and providing an aperture formed as part of the pedestal, the aperture in fluid communication with the cavity;

detecting the pressure applied to the pressure sensing element in the cavity by measuring the pressure sensor output change due to the deflection of at least a portion of the pressure sensing element.

15. The method of making a pressure sensor of claim 14, further comprising the steps of forming at least a partial vacuum in the cap cavity by bonding the bottom surface of the third wafer to top surface of first wafer.

\* \* \* \* \*